(12) United States Patent
Lee

(10) Patent No.: US 7,288,452 B2
(45) Date of Patent: Oct. 30, 2007

(54) METHOD FOR MANUFACTURING SEMICONDUCTOR DEVICE

(75) Inventor: Kae Hoon Lee, Mapo-gu (KR)

(73) Assignee: Dongbu Electronics Co., Ltd., Seoul (KR)

( * ) Notice: Subject to any disclaimer, the term of this patent is extended or adjusted under 35 U.S.C. 154(b) by 149 days.

(21) Appl. No.: 11/024,740

(22) Filed: Dec. 30, 2004

(65) Prior Publication Data

US 2005/0142801 A1 Jun. 30, 2005

(30) Foreign Application Priority Data

Dec. 30, 2003 (KR) .................. 10-2003-0100876

(51) Int. Cl.
*H01L 21/8234* (2006.01)
*H01L 21/8242* (2006.01)

(52) U.S. Cl. .............. 438/238; 438/381; 438/954; 257/E21.058; 257/E21.545

(58) Field of Classification Search .......... 438/238, 438/381, 513, 954, 257, 267, 276, 680, 692, 438/706, 745, 740, 712, 734, 743, 744, 756, 438/757

See application file for complete search history.

(56) References Cited

U.S. PATENT DOCUMENTS

| 6,284,603 | B1 * | 9/2001 | Ho Simon et al. | 438/264 |
| 6,436,768 | B1 * | 8/2002 | Yang et al. | 438/266 |
| 6,524,914 | B1 * | 2/2003 | He et al. | 438/264 |
| 6,541,816 | B2 * | 4/2003 | Ramsbey et al. | 257/324 |
| 6,653,189 | B1 * | 11/2003 | Haddad et al. | 438/258 |

* cited by examiner

*Primary Examiner*—David Nhu
(74) *Attorney, Agent, or Firm*—Lowe Hauptman Ham & Berner LLP

(57) ABSTRACT

A method of manufacturing a semiconductor device including forming an ONO film on a semiconductor substrate and a hard mask layer on the ONO film, forming a trench by etching the hard mask layer and the ONO film on a field region of the semiconductor substrate using a photo etch process and etching the field region of the semiconductor substrate, and forming a device separator at the trench. The method also includes exposing the ONO film by removing the hard mask layer on the ONO film, and leaving the ONO film only on a prospective SONOS gate in a cell region of the semiconductor substrate and removing the ONO film the remainder region thereof. The method further includes forming a gate oxide film on the semiconductor substrate at an outside of the ONO film, and forming a gate electrode on the gate oxide film and the ONO film, respectively.

7 Claims, 4 Drawing Sheets

METHOD FOR MANUFACTURING SEMICONDUCTOR DEVICE

BACKGROUND OF THE INVENTION

1. Field of the Invention

The present invention relates to a method of manufacturing a semiconductor device, and more particularly, to a method of manufacturing a semiconductor device which simplifies a manufacturing process.

2. Discussion of the Related Art

In general, semiconductor memory devices are divided into two types: a random access memory (RAM) and a read only memory (ROM). The RAM, such as a dynamic random access memory (DRAM) and a static access memory (SRAM), is fast to input and output data and is volatile such that previously stored data is removed after a predetermined time has passed. Although the ROM keeps data once it is stored, it is slow to input and output data. The ROM includes a Rom, a programmable ROM (PROM), an erasable PROM (EPROM), and an electrically erasable PROM (EEPROM). Recently, there is an increasing demand for EEPROM being capable of electrically programming or removing data. The EEPROM or a cell of a flash memory having a bulk erasing function has a stack type gate structure in which a floating gate and a control gate are stacked.

The flash memory includes a unit string having sixteen cells being coupled in series. The flash memory is divided into a NAND type flash memory having the unit string being coupled in parallel between an earthed line with a bit line, and a NOR type flash memory having each of the cells coupled in parallel between the bit line and the ground line. The NAND type flash memory is advantageous for high integration. The NOR type flash memory is advantageous for high speed operation. The NOR type flash memory uses a common source. In other words, in general, one contact per sixteen cells is formed, and a source line of the sixteen cells is coupled to an n+ diffusion layer.

Meanwhile, a quantum trap device has been the center of public attention as a nonvolatile SRAM or a flash memory for a next generation device. The quantum trap device has a silicon-oxide-nitride-oxide-silicon (SONOS) structure. Operation of the SONOS device having the SONOS structure is divided into reading, programming, and erasing. In the case of programming, when a program voltage is applied to the gate of the transistor and a drain of the cell, a hot electron is formed and then surrounded by a nitride film being at an area adjacent to the drain. Thus, a threshold voltage of the transistor is increased. Therefore, data programming is performed.

In case of erasing operation, when the gate, the drain and the source are opened and an erasing voltage is applied to the semiconductor substrate, the electrode surrounded by the nitride film is pushed away from the semiconductor substrate. Thus, the threshold voltage is lowered. Therefore, the data erasing is performed.

In the case of reading operation, a reading voltage is applied to the gate, and an electric current flowing through a space between the source and the drain is sensed by a sensing circuit. Accordingly, the data reading is performed.

In the case of the SONOS, since program/removal characteristics and retention characteristics must be traded off with each other, it is impossible to improve the program/removal characteristic and the retention characteristic simultaneously. Accordingly, a proper trade off point between the removing characteristic and the retention characteristic is desired so as to optimize an oxide-nitride-oxide layer of the SONOS.

In the nonvolatile memory device having a related art SONOS structure, as illustrated in FIG. 1, a cell region of an active region of a P type semiconductor substrate 10 is defined by a device separator 13 in a trench 11 in a filed region of the semiconductor substrate 10. A gate oxide film 15 is formed in the cell region of the semiconductor substrate 10. First and second electrodes 21 and 23 are separately formed. A nitride film 31 and an oxide film 33 are formed on the gate oxide film 15, and a third gate electrode 35 is formed thereon. The third gate electrode 35 is disposed between the, first electrode 21 and the second electrode 23. The gate oxide film 15, the nitride film 31, and the oxide film 33 form an oxide-nitride-oxide film (ONO) 30. The gate oxide film 15 plays a role as a bottom tunneling oxide film of the ONO film 30, the nitride film 31 as a trap nitride film of the ONO film 30, and the oxide film 33 as a top oxide film.

When the nonvolatile memory device having the related art SONOS structure is manufactured, the first and second gate electrodes 21 and 23 are formed by forming the gate oxide film 15 on the cell region of the semiconductor substrate 10, stacking polycrystalline silicon for the first and second electrodes 21 and 23, and removing an unnecessary portion of polycrystalline silicon by a photoetch process.

In the related art, a process of stacking polycrystalline silicon and a process of photoetching are performed twice so as to form the first and second gate electrodes 31 and 33 and the third gate electrode 35. Therefore, a process for manufacturing the gate electrode of the nonvolatile memory device having the SONOS structure becomes complicated.

SUMMARY OF THE INVENTION

Accordingly, the present invention is directed to a method of manufacturing a semiconductor device that substantially obviates one or more problems due to limitations and disadvantages of the related art.

The present invention advantageously provides a method of manufacturing a semiconductor device so as to simplify a manufacturing process of a gate electrode of a nonvolatile memory device having a SONOS structure.

The present invention also provides a method of manufacturing a semiconductor device so as to increase price competitiveness of a nonvolatile memory device with the SONOS structure by lowering a manufacturing cost.

Additional advantages, objects, and features of the invention will be set forth in part in the description which follows and in part will become apparent to those having ordinary skill in the art upon examination of the following. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of manufacturing a semiconductor device includes forming an ONO film on a semiconductor substrate and a hard mask layer on the ONO film, forming a trench by etching the hard mask layer and the ONO film on a field region of the semiconductor substrate using a photo etch process and etching the field region of the semiconductor substrate, forming a device separator at the trench, exposing the ONO film by removing the hard mask layer on the ONO film, leaving only a portion in which a SONOS gate to be formed in a cell region of the semiconductor substrate and removing the rest of region thereof, forming a gate oxide film on the semiconductor substrate at an outside of the ONO film, and forming a gate electrode on the gate oxide film and the ONO film, respectively.

It is to be understood that both the foregoing general description and the following detailed description of the present invention are exemplary, but are not restrictive of the invention.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to exemplary embodiments of the present invention which are illustrated in the accompanying drawings. Wherever possible, the same reference numbers will be used throughout the drawings to refer to the same or like parts.

Figure 1:
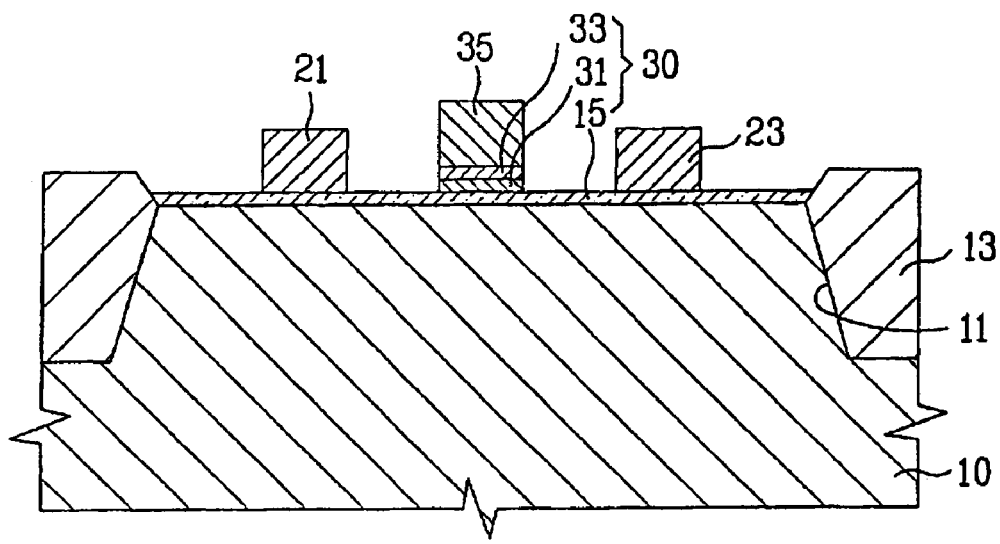
FIG. 1 illustrates a cross sectional diagram showing a cell region of a nonvolatile memory device of a related art silicon-oxide-nitride-oxide-silicon structure (SONOS)
Figure 2A:
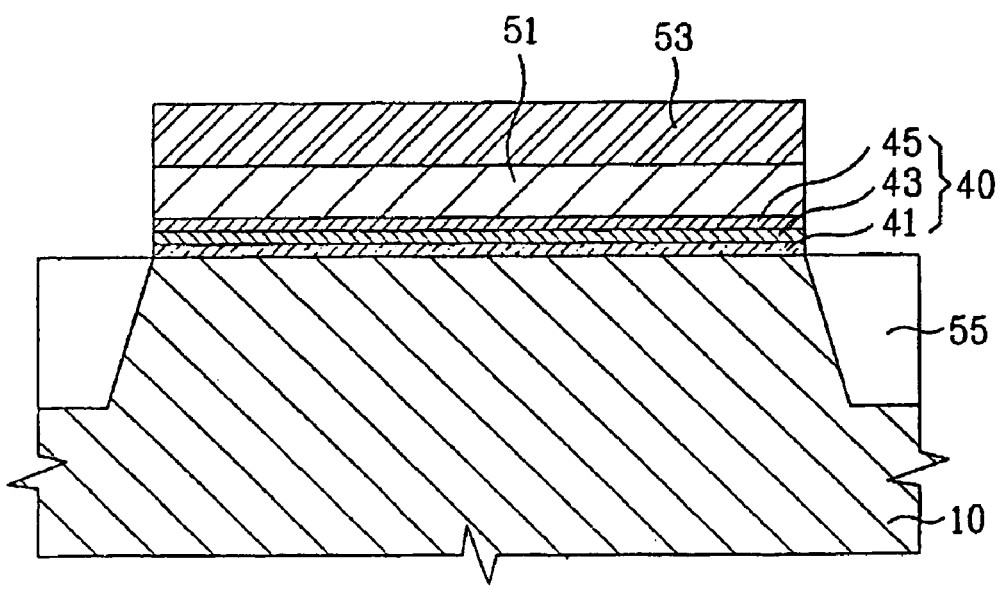
FIG. 2A to FIG. 2F illustrate a diagram showing a method for manufacturing a semiconductor device in accordance with the present invention.

FIG. 2A to FIG. 2F illustrate a method for manufacturing a semiconductor device in accordance with the present invention. Referring to FIG. 2A, a bottom oxide film 41, a nitride film 43 and a top oxide film 45 are sequentially formed to form an ONO film 40 on the semiconductor substrate 10, such as a single-crystalline silicon substrate. The bottom oxide film 41 is grown to a thickness of about 50 to about 100 Å by, for example, a wet oxidation process. A nitride 43 is stacked to a thickness of about 20 to about 50 Å and an oxide film 45 is stacked to a thickness of about 30 to about 100 Å. The oxide film 45 is formed by a high temperature oxidation (HTO) process. The bottom oxide film 41 plays a role as a tunneling oxide film and the nitride film 43 as a trap nitride film.

On the ONO film 40, a hard mask layer such as a nitride film 51 is formed to a thickness of about 1000 to about 3000 Å by, for example, a low pressure chemical vapor deposition process. In this case, the nitride film 51 plays a role as an etch stop film in a following chemical mechanical polishing (CMP) process.

The pattern of a sensitive film 53 for forming a trench on the nitride film 51 is spin coated to a thickness of about 5000 to about 10000 Å. With the sensitive film 53 as a mask layer, a dry etch process such as a reactive ion etching (RIE) is performed on the nitride film 51 and the ONO film 40. Accordingly, a filed region of the semiconductor substrate 10 is exposed. The semiconductor substrate 10 is etched to a depth of about 3000 to about 5000 Å by a reactive ion etch process.

Therefore, since a trench 55 is formed in the filed region of the semiconductor substrate 10, an active region for the cell region of the semiconductor substrate 10 is defined. Additionally, although it is not illustrated in the drawing, it is apparent that the active region for a logic region and a high pressure region of the non volatile memory device with a SONOS structure are simultaneously defined.

Figure 2B:
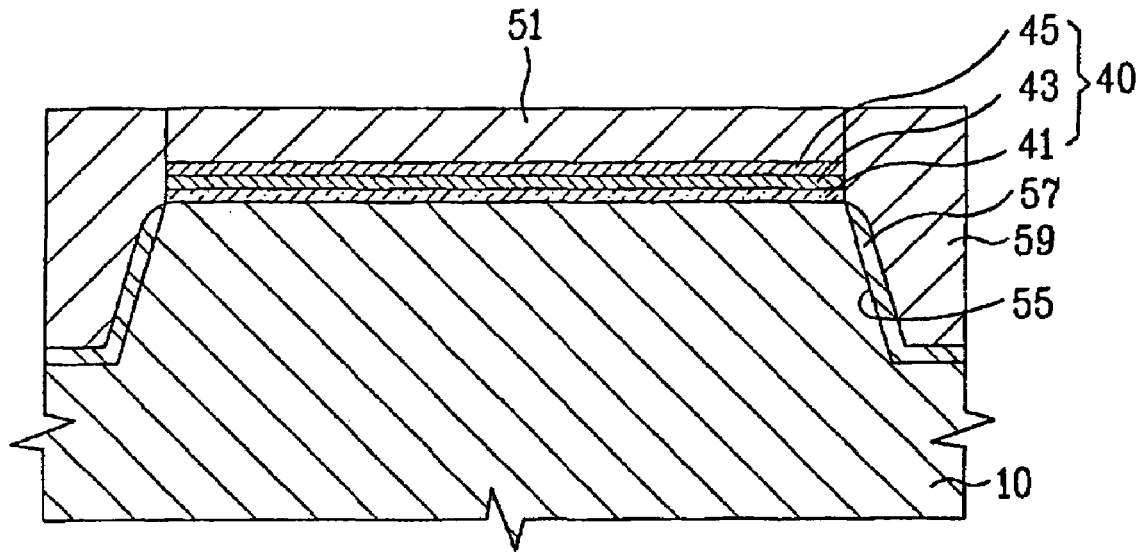

Referring to FIG. 2B, the sensitive film 53 in FIG. 2A is removed by ashing and stripping. The semiconductor substrate 10 is cleaned by, for example, a wet cleaning process using a cleaning solution.

When the dry etching is processed for forming the trench 55, a liner oxide film 57 is formed to be about 100 to about 400 Å thick on an etch surface of the semiconductor substrate 10 in the trench 55 by, for example, a heat oxidation process. The oxide film 57 reduces etch damage generated on the etch surface of the semiconductor substrate 10 in the trench 55.

In order to fill the gap in the trench 55, an insulating film, for example, an oxide film such as a tetra ethyl ortho silicate film or a nondoped silicate glass film is stacked to a thickness of about 5000 to about 10000 Å on the nitride film 51 together with the trench 55. This forms the device separator 59 on the on the nitride film 51. The oxide film may be stacked by ozone-tetra ortho silicate glass (TEOS/O3) Atmospheric Pressure Chemical Vapor Deposition, plasma enhanced chemical vapor deposition (PECVD), or a high density plasma chemical vapor deposition (HDP CVD), although it differs from a design of the semiconductor device. Thereafter, the oxide film is made denser by the heat treatment process in order to prevent a current leakage through the device separator 59 from increasing.

A device separator 59 remains in the trench 55 while the oxide film on the nitride film 51 outside of the trench 55 is completely removed by smoothing the oxide film and the nitride film 51 using, for example, a chemical mechanical polishing (CMP) process.

Although the device separator 59 and the nitride film 51 are illustrated as if they have the same height, the surface of the device separator 59 is actually positioned lower than the surface of the nitride film 51 after the CMP is completed. The chemical mechanical process (CMP) is prolonged so as to completely remove the oxidation film from the nitride film 51.

Figure 2C:
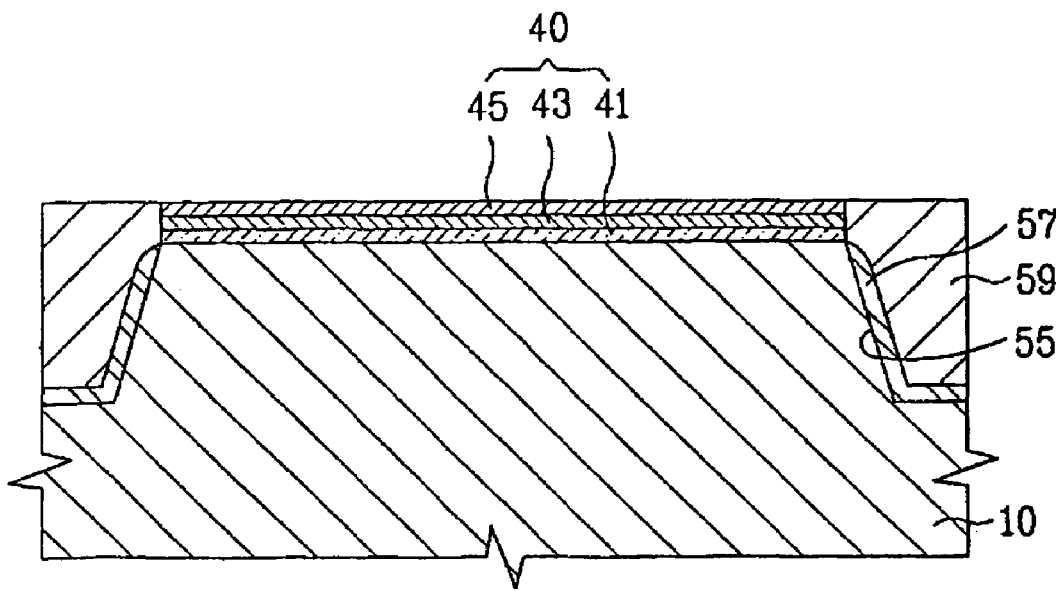

Referring to FIG. 2C, the surface of the device separator 59 is removed a predetermined thickness by a wet etch process using a hydrofluoric acid (HF) solution so as to lower the surface of the device separating film 59. This lowers a step height between the active region of the semiconductor substrate 10 and the device separating film 59.

The nitride film 51 of FIG. 2B is removed by the wet dry etch process using the phosphoric solution. A pad oxide film 11 is removed by an isotropic wet etch process using the HF solution, whereby the ONO film 40 is exposed.

An ion implantation region (not shown) for controlling a threshold voltage (VT) is formed by performing an ion implantation process on a region with the SONOS structure in the cell region of the semiconductor substrate 10.

Figure 2D:
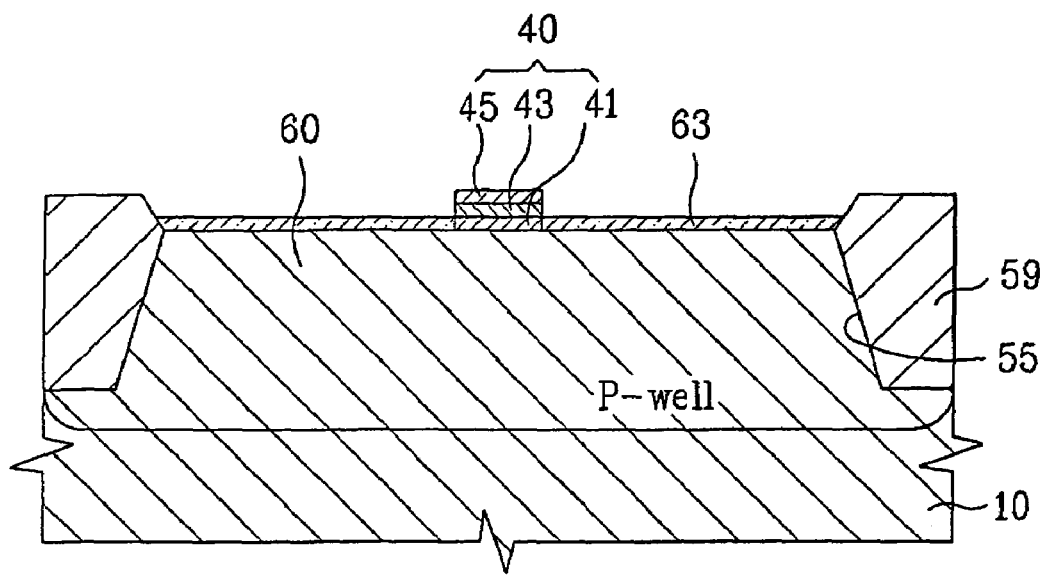

Referring to FIG. 2D, a pattern of the ONO film 40 is left on the region with the SONOS structure in the cell region of the semiconductor substrate 10. All the ONO film in a remainder region is removed by a photoetch process, such that the surface of the active region of the semiconductor substrate 10 outside of the ONO film 40 is exposed.

The ion implantation is performed to form a, e.g., P well region 60 for NMOS transistor in the cell region of the semiconductor substrate 10. Although it is not illustrated in the drawing, it is apparent that N well and P well regions are formed using the ion implantation process in a high-pressure region and a logic region of the semiconductor substrate 10 before or after the forming the pattern of the ONO film 40. For convenience, description of this will be omitted.

A gate oxide film 63 is formed to a thickness of about 20 to about 50 Å by, for example, the heat oxidation process on the cell region of the semiconductor substrate 10. In more detail, although not illustrated in the drawing, before the gate oxide film 63 is formed, a high voltage gate oxide film is formed on the exposed active region of the semiconductor substrate 10. The high pressure oxide film is left on the high pressure region of the semiconductor substrate 10 using the photo etch process. The oxide film on the rest regions of the semiconductor substrate 10 is removed. The gate oxide film 63 is formed on the logic region and the cell region of the semiconductor substrate 10 by the heat oxidation process.

Figure 2E:
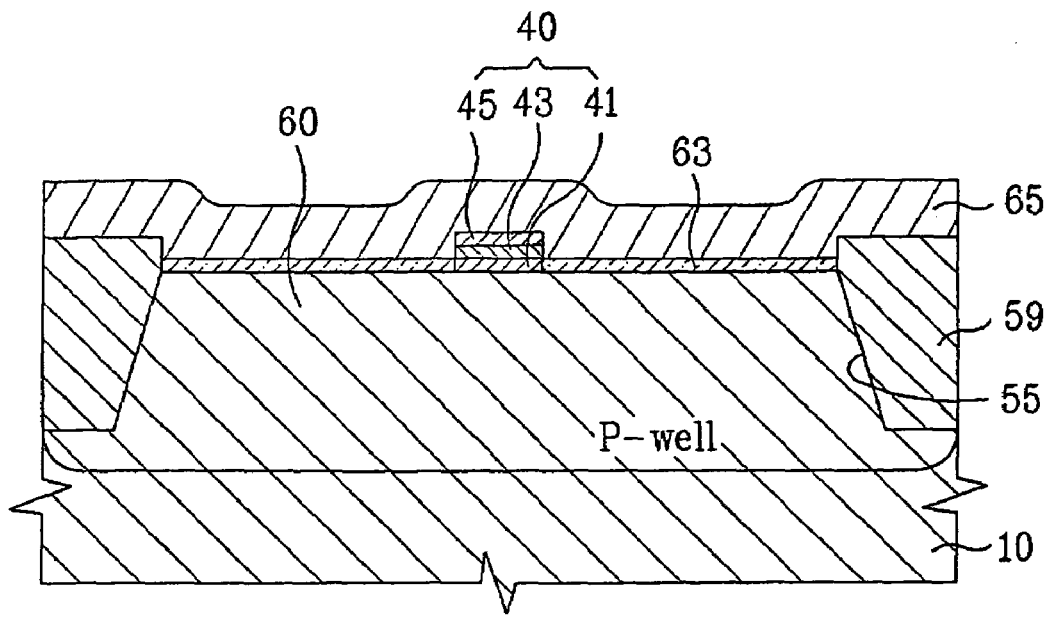

Referring to FIG. 2E, polycrystalline silicon 65 is formed on the gate oxide film 63 and the top oxide film 45 in the cell region. In addition, although it is not illustrated in the drawing, the polycrystalline silicon 65 is also formed on the logic region of the high pressure oxide film and the gate oxide film of the high pressure region.

A pattern of the sensitive film (not shown) is formed as an ion implantation mask layer for exposing an N type impurity ion implantation region on the polycrystalline silicon 65. N type impurity such as phosphorus is ion implanted on the polycrystalline silicon 65 in the cell region. The phosphorus is ion implanted to the polycrystalline silicon 65 for a NMOS transistor of the high pressure region and the logic region together with the cell region. The pattern of the sensitive film is removed and the semiconductor substrate 10 is cleaned by the cleaning solution.

Figure 2F:
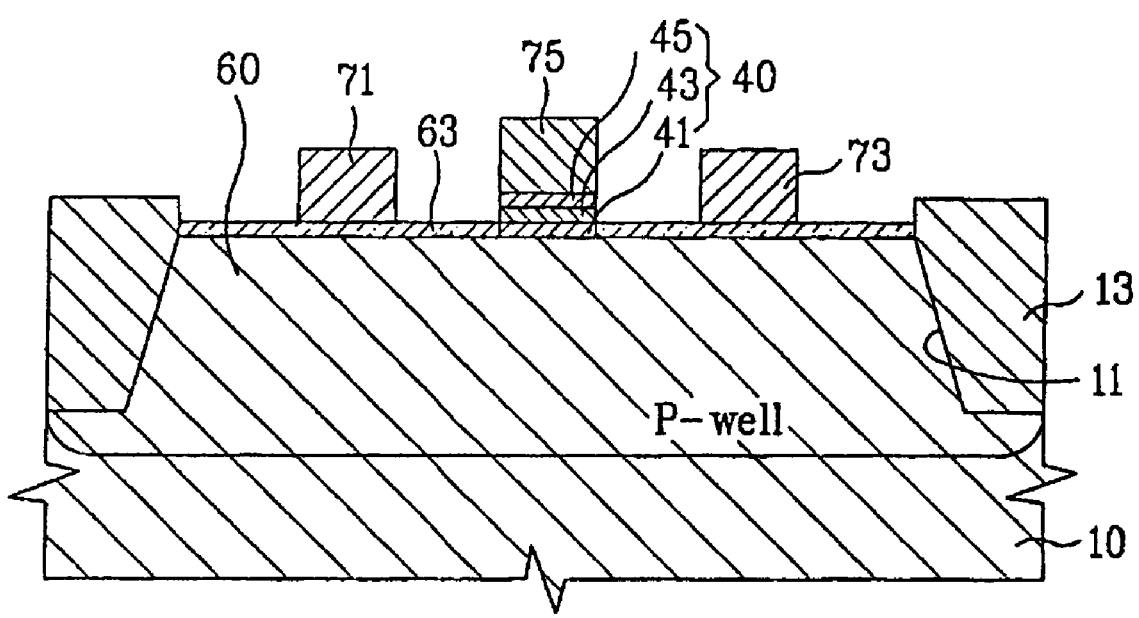

Referring to FIG. 2F, the first and second gate electrodes 71 and 73 are formed respectively by leaving a polycrystalline silicon layer of FIG. 2E on a gate electrode formation region of the gate oxide film 63. The third gate electrode 75 is formed by leaving the polycrystalline silicon layer on the gate electrode formation region of the ONO film 40.

Although it is not illustrated in the drawing, it is apparent that the gate electrode is formed on the high pressure region of the semiconductor substrate 10 and on the gate electrode region of the logic region.

Accordingly, contrary to the related art, in the present invention, the gate electrode region is simultaneously formed on the cell region, the high pressure region, and the logic region of the semiconductor substrate. The process for forming the gate electrode of the nonvolatile memory device having a SONOS structure is simplified. Therefore, the manufacturing cost of the nonvolatile memory device is reduced, thereby increasing product competitiveness.

As described above, the method for manufacturing the semiconductor device of the present invention includes forming a nitride film on the ONO film on a semiconductor substrate, etching the nitride film and the ONO film in a filed region of the semiconductor using a photo etching process, forming a trench by etching the semiconductor substrate to a predetermined depth, and forming a device separator by gap filling an oxide film for the device separator to the trench and smoothing the oxide film. In the cell region, the ONO film is left in only a portion in which the SONOS gate to be formed, the rest surface of the semiconductor substrate is exposed, and a gate electrode is formed respectively on the gate dielectric film and the ONO film Therefore, in the present invention, since an electrode is simultaneously formed on the ONO film and the oxide film. The process for forming the gate electrode of the nonvolatile memory device having a SONOS structure is simplified.

Korean Patent Application No. P2003-00876, filed on Nov. 30, 2004, is hereby incorporated by reference in its entirety.

It will be apparent to those skilled in the art that various modifications and variations can be made in the present invention without departing from the spirit or scope of the inventions. Thus, it is intended that the present invention covers the modifications and variations of this invention within the scope of the appended claims and their equivalents.

What is claimed is:

1. A method of manufacturing a semiconductor device, comprising:
   forming an ONO film immediately on top of a semiconductor substrate and a hard mask layer on top of the ONO film;
   forming a trench by etching the hard mask layer and the ONO film in a field region of the semiconductor substrate using a photo etch process and then etching the field region of the semiconductor substrate to a predetermined depth;
   forming a device separator at the trench;
   exposing a top surface of the ONO film by removing the hard mask layer on the ONO film;
   leaving the ONO film only on a prospective SONOS gate region in a cell region of the semiconductor substrate and removing a remainder of the ONO film;
   forming a gate oxide film on the semiconductor substrate at an outside of the ONO film; and
   simultaneously forming at least one gate electrode on the gate oxide film and an additional gate electrode on the ONO film.

2. The method of claim 1, wherein the step of forming a gate oxide film includes forming the gate oxide film in the cell region of the semiconductor substrate and in a logic region of the semiconductor substrate.

3. The method of claim 1, wherein the step of forming an ONO film includes forming the ONO film including a bottom oxide film with a thickness of about 50 to about 100 Å, a trap nitride film with a thickness of about 20 to about 50 Å, and a top oxide film with a thickness of about 30 to about 100 Å.

4. The method of claim 3, wherein the step of forming an ONO film includes forming the bottom oxide film by wet oxidation.

5. The method of claim 3, wherein the step of forming an ONO film includes forming the top oxidation film by high temperature oxidation.

6. The method of claim 1, wherein the least one gate electrode on the gate oxide film and the additional gate electrode on the ONO film are formed from a same layer of polycrystalline silicon.

7. The method of claim 1, wherein simultaneously forming at least one gate electrode on the gate oxide film and an additional gate electrode on the ONO film comprises: forming a polycrystalline silicon layer on the gate oxide film and the ONO film; and removing a portion of the polycrystalline silicon layer while leaving a portion of the polycrystalline silicon layer on a gate electrode formation region of the gate oxide film and leaving a portion of the polycrystalline silicon layer on a gate electrode formation region of the ONO film.

* * * * *